(12) United States Patent
Lee et al.

(10) Patent No.: US 8,673,754 B2
(45) Date of Patent: Mar. 18, 2014

(54) METHOD OF FORMING GATE DIELECTRIC LAYER AND METHOD OF FABRICATING SEMICONDUCTOR DEVICE

(75) Inventors: Seung-Mi Lee, Gyeonggi-do (KR); Yun Hyuck Ji, Gyeonggi-do (KR); Beom-Yong Kim, Gyeonggi-do (KR); Bong-Seok Jeon, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 0 days.

(21) Appl. No.: 13/494,288

(22) Filed: Jun. 12, 2012

(65) Prior Publication Data

US 2013/0240957 A1 Sep. 19, 2013

(30) Foreign Application Priority Data

Mar. 19, 2012 (KR) .................. 10-2012-0027843

(51) Int. Cl.
*H01L 21/425* (2006.01)

(52) U.S. Cl.
USPC .... 438/528; 257/192; 257/369; 257/E29.006; 257/E29.255

(58) Field of Classification Search
USPC .............. 438/528; 257/192, 369, E29.006, 257/E29.255
See application file for complete search history.

(56) References Cited

U.S. PATENT DOCUMENTS

| | | | |
|---|---|---|---|
| 2007/0102768 A1* | 5/2007 | Shimizu et al. | 257/369 |
| 2011/0049639 A1 | 3/2011 | Doornbos et al. | |
| 2013/0087833 A1* | 4/2013 | Wang | 257/192 |
| 2013/0105905 A1* | 5/2013 | Ji et al. | 257/369 |
| 2013/0150907 A1* | 6/2013 | McDonald et al. | 607/2 |
| 2013/0175577 A1* | 7/2013 | Tan et al. | 257/190 |

FOREIGN PATENT DOCUMENTS

| | | |
|---|---|---|
| KR | 1020050007663 | 1/2005 |
| KR | 1020050049611 | 5/2005 |
| KR | 100660909 | 12/2006 |
| KR | 1020070059707 | 6/2007 |
| KR | 1020070112830 | 11/2007 |

\* cited by examiner

*Primary Examiner* — Matthew W Such
*Assistant Examiner* — Samuel Lair
(74) *Attorney, Agent, or Firm* — IP & T Group LLP

(57) ABSTRACT

A method for fabricating a semiconductor device includes ion-implanting germanium into a monocrystalline silicon-containing substrate; forming a gate oxide layer over a surface of the monocrystalline silicon-containing substrate and forming, under the gate oxide layer, a germanium-rich region in which the germanium is concentrated, by performing a plasma oxidation process; and crystallizing the germanium-rich region by performing an annealing process.

22 Claims, 17 Drawing Sheets

<DRY OXIDATION>    <PLASMA OXIDATION>

METHOD OF FORMING GATE DIELECTRIC LAYER AND METHOD OF FABRICATING SEMICONDUCTOR DEVICE

CROSS-REFERENCE TO RELATED APPLICATIONS

The present application claims priority of Korean Patent Application No. 10-2012-0027843, filed on Mar. 19, 2012, which is incorporated herein by reference in its entirety.

BACKGROUND

1. Field

Exemplary embodiments of the present invention relate to a semiconductor device, and more particularly, to a method of forming a gate dielectric layer and a method of fabricating a semiconductor device using the same.

2. Description of the Related Art

To accommodate high integration of a semiconductor device, the thickness of a gate dielectric layer is being decreased for transistors. Here, when the thickness of the gate dielectric layer is reduced, leakage current increases. To address such features, a gate dielectric layer with a dielectric constant higher than a silicon oxide has been developed. When a gate dielectric layer is said to have high dielectric constant (high-k), it indicates a dielectric material with a dielectric constant greater than 4 (for example, 7). The high-k gate dielectric layer may have excellent thermal stability at a high temperature and may suppress leakage current.

According to an exemplary method, when fabricating a PMOSFET (hereinafter, referred to as a 'PMOS') using a high-k gate dielectric layer, a capping layer such as alumina ($Al_2O_3$) is used between the high-k gate dielectric layer and a gate electrode to control a threshold voltage (Vt) variation. However, in the case of applying the capping layer such as alumina, as a threshold voltage variation increases, degradation of mobility occurs, and thus, it is difficult to secure a threshold voltage of a desired level.

SUMMARY

An embodiment of the present invention is directed to a semiconductor device which can secure the adequate threshold voltage of transistors, and a method of fabricating the same.

In accordance with an embodiment of the present invention, a method for fabricating a semiconductor device includes: ion-implanting germanium into a monocrystalline silicon-containing substrate; forming a gate oxide layer over a surface of the monocrystalline silicon-containing substrate and forming, under the gate oxide layer, a germanium-rich region in which the germanium is concentrated, by performing a plasma oxidation process; and crystallizing the germanium-rich region by performing an annealing process.

In accordance with another embodiment of the present invention, a method for fabricating a semiconductor device includes: ion-implanting germanium into a monocrystalline silicon-containing substrate, wherein the substrate includes a first region and a second region; forming a first gate dielectric layer over a surface of the monocrystalline silicon-containing substrate and forming, under the first gate dielectric layer, a germanium-rich region in which the germanium is concentrated, by performing a plasma oxidation process; crystallizing the germanium-rich region by performing an annealing process; selectively removing the first gate dielectric layer at the second region; and forming a second gate dielectric layer over an entire surface of the monocrystalline silicon-containing substrate.

In accordance with another embodiment of the present invention, a method for fabricating a semiconductor device includes: ion-implanting germanium into a second region of a monocrystalline silicon-containing substrate, wherein the monocrystalline silicon-containing substrate includes a first region and the second region; forming a gate oxide layer over a surface of the monocrystalline silicon-containing substrate and forming, under the gate oxide layer of the second region, a germanium-rich region in which the germanium is concentrated, by performing a plasma oxidation process; and crystallizing the germanium-rich region by performing an annealing process.

In accordance with yet another embodiment of the present invention, a method for fabricating a semiconductor device includes: ion-implanting germanium into a first region and a second region of a monocrystalline silicon-containing substrate, wherein the monocrystalline silicon-containing substrate includes the first region where a first PMOS is formed, the second region where a second PMOS is formed and a third region where an NMOS is formed; forming a first gate dielectric layer over a surface of the monocrystalline silicon-containing substrate and forming, under the first gate dielectric layer of the first and second regions, a germanium-rich region in which the germanium is concentrated, by performing a plasma oxidation process; crystallizing the germanium-rich region by performing an annealing process; selectively removing the first gate dielectric layer of the second region; and forming a second gate dielectric layer over an entire surface of the monocrystalline silicon-containing substrate.

In accordance with still another embodiment of the present invention, a semiconductor device includes: a gate dielectric layer formed over a substrate and including a plasma oxide; a gate electrode formed over the gate dielectric layer; and a channel region including a monocrystalline germanium-containing region, wherein the monocrystalline germanium-containing region is formed in the substrate under the gate dielectric layer.

DETAILED DESCRIPTION

Figure 1A:
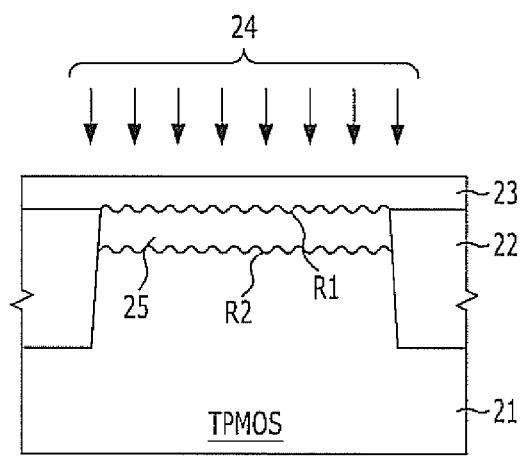
FIGS. 1A to 1E are cross-sectional views illustrating a method of fabricating a semiconductor device in accordance with a first embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIGS. 1A to 1E are cross-sectional views illustrating a method of fabricating a semiconductor device in accordance with a first embodiment of the present invention.

Referring to FIG. 1A, a substrate 21 may include a transistor region in which a transistor is formed. The transistor region may include an NMOSFET (hereinafter, referred to as an 'NMOS') or a PMOSFET (hereinafter, referred to as a 'PMOS'). Hereinafter, in this first embodiment, the transistor region is exemplified as a region in which a PMOS is formed. A PMOS region may include a PMOS having a thick gate dielectric layer ("TPMOS"). The substrate 21 may include silicon, for example, monocrystalline silicon.

Isolation regions 22 are formed in the substrate 21. The isolation regions 22 may be formed through an STI (shallow trench isolation) process. For example, after forming a pad layer (not shown) on the substrate 21, the pad layer and the substrate 21 are etched using an isolation mask (not shown). By performing such etching, trenches are defined. By gap-filling a dielectric layer in the trenches after defining the trenches, the isolation regions 22 are formed. As the isolation regions 22, a wall oxide, a liner and a spin-on dielectric (SOD) layer may be sequentially formed. The liner may include a silicon nitride liner and a silicon oxide liner.

Next, a passivation layer 23 is formed on the entire surface of the substrate 21. The passivation layer 23 serves as a screen in a subsequent ion implantation process. For example, the passivation layer 23 functions to minimize damage to the substrate 21 while ion-implanting a dopant or other materials into the substrate 21. The passivation layer 23 may be formed, for example, through a thermal oxidation process, and may include a silicon oxide. Here, the passivation layer 23 is referred to as a screen oxide. The passivation layer 23 may be formed to a thickness of 50~100 Å.

After forming the passivation layer 23, germanium ion implantation 24 is performed for the substrate 21. The germanium ion implantation 24 may be formed with energy of 1~10 KeV to a dose of $1 \times 10^{14} \sim 1 \times 10^{17}$ atoms/cm$^3$ at a temperature of $-150 \sim -50°$ C. The germanium ion implantation 24 may be performed for the transistor region, in particular, the channel region, of the substrate 21.

By performing the above-described germanium ion implantation 24, an amorphous germanium-containing region 25 with a desired depth is formed in the surface of the substrate 21. For example, as germanium reacts with the silicon constituent of the substrate 21, the amorphous germanium-containing region 25 with a silicon germanium (SiGe) structure is formed. The surface roughness of an upper surface R1 and a lower surface R2 of the amorphous germanium-containing region 25 is substantially great. Such great surface roughness is caused by physical damage resulting from ion bombardment upon ion implantation.

While not shown, a well ion implantation process and a channel ion implantation process generally known in the art may be performed before the germanium ion implantation 24.

In the case where the substrate 21 includes an NMOS region, a P-type well is formed, and in the case where the substrate 21 includes a PMOS region, an N-type well is formed. For example, in order to form a P-type well, a P-type impurity such as boron (B) or a boron difluoride (BF$_2$) may be implanted. Furthermore, in order to form an N-type well, an N-type impurity such as phosphorus (P) or arsenic (As) may be implanted.

After the well ion implantation process, a channel region may be formed through any reasonably suitable process for performing channel ion implantation. An N channel region may be formed in an NMOS region, and a P channel region may be formed in a PMOS region. In order to form the P channel region, an N-type impurity such as phosphorus (P) or arsenic (As) may be implanted. In order to form the N channel region, a P-type impurity such as boron (B) may be implanted. The channel ion implantation process may be performed after the germanium ion implantation 24.

Figure 1B:
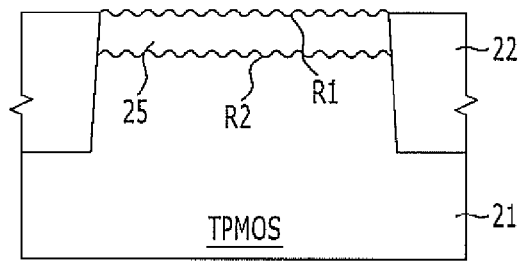

Referring to FIG. 1B, the passivation layer 23 is removed through a cleaning process. The passivation layer 23 may be removed using wet etching. For example, in the case where the passivation layer 23 includes a silicon oxide, a hydrofluoric acid (HF) or a chemical containing a hydrofluoric acid may be used.

Even after the passivation layer 23 is removed, the surface roughness of the upper surface R1 and the lower surface R2 of the amorphous germanium-containing region 25 is not improved.

Figure 1C:
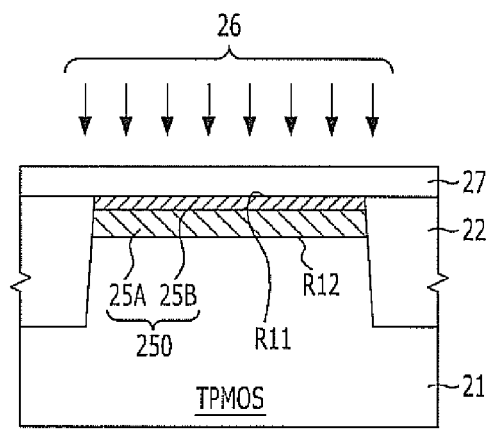

Referring to FIG. 1C, a plasma oxidation process 26 is performed. The plasma oxidation process 26 may be performed at a temperature of 350~500° C. By the plasma oxidation process 26, a gate dielectric layer 27 is formed on the surface of the substrate 21. The gate dielectric layer 27 includes a plasma oxide. The thickness of the gate dielectric layer 27 may be about 55 Å. Since oxygen ions present in plasma serve as a main factor that determines an oxidation rate when performing the plasma oxidation process 26, oxidation is performed at a low temperature by controlling a bias. Through the plasma oxidation process 26, an amorphous germanium-containing region 250 is divided into a first amorphous germanium-containing region 25A and a second amorphous germanium-containing region 25B. The first amorphous germanium-containing region 25A is positioned under the second amorphous germanium-containing region 25B. The germanium concentration of the second amorphous germanium-containing region 25B is higher than that of the first amorphous germanium-containing region 25A. For example, as silicon is consumed from the upper part of the amorphous germanium-containing region 25 with the silicon germanium structure by the plasma oxidation process 26, the second amorphous germanium-containing region 25B containing a large amount of germanium is formed. A portion which is not influenced by the plasma oxidation process 26 remains as the first amorphous germanium-containing region 25A.

In this way, the amorphous germanium-containing region 250 has a concentration gradient by the plasma oxidation process 26. Also, the surface roughness of an upper surface R11 and a lower surface R12 of the amorphous germanium-containing region 250 may be improved through the plasma oxidation process 26.

The plasma oxidation process 26 has an oxidation rate greater than that of a dry oxidation process. Accordingly, oxidation is rapidly performed at a low temperature. Furthermore, oxidation of a silicon layer containing germanium is performed more rapidly than oxidation of a silicon layer not containing germanium.

Figure 1D:
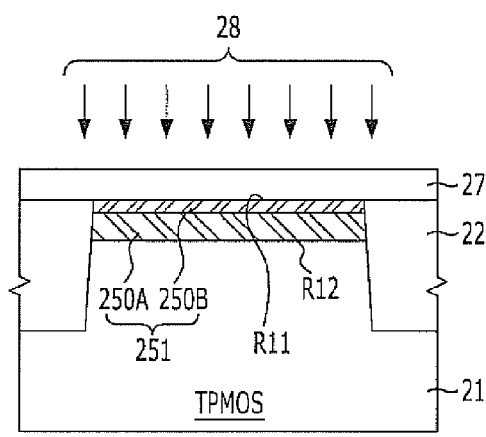

Referring to FIG. 1D, an annealing process 28 is performed. The annealing process 28 may include rapid thermal annealing (RTA). Rapid thermal annealing may be performed for 30 seconds at a temperature of 850~900° C. The amorphous germanium-containing region 250 is crystallized by the annealing process 28. Therefore, a crystalline germanium-containing region 251 is formed by the annealing process 28. The crystalline germanium-containing region 251 includes a first crystalline germanium-containing region 250A and a second crystalline germanium-containing region 250B. The germanium concentration of the second crystalline germanium-containing region 250B is higher than that of the first crystalline germanium-containing region 250A. For example, the second crystalline germanium-containing region 250B may have a germanium concentration close to 100%. Accordingly, the second crystalline germanium-containing region 250B may be referred to as a crystalline germanium-rich region. In the case where the substrate 21 includes monocrystalline silicon, the crystalline germanium-containing region 251 may be a monocrystalline germanium-containing region.

As described above, after the germanium ion implantation 24, the gate dielectric layer 27 is formed through the plasma oxidation process 26. Also, by the low temperature plasma oxidation process 26, the second amorphous germanium-containing region 25B containing a large amount of germanium is formed. Moreover, the surface roughness of the upper surface and the lower surface of the amorphous germanium-containing region 250 may be improved by the plasma oxidation process 26. Furthermore, by performing the annealing process 28, the amorphous germanium-containing region 250 may be crystallized into the crystalline germanium-containing region 251.

By forming the crystalline germanium-containing region 251 under the gate dielectric layer 27, the threshold voltage of the transistor may be controlled. In particular, in the case of a PMOS, a threshold voltage of a desired level may be obtained.

Figure 1E:
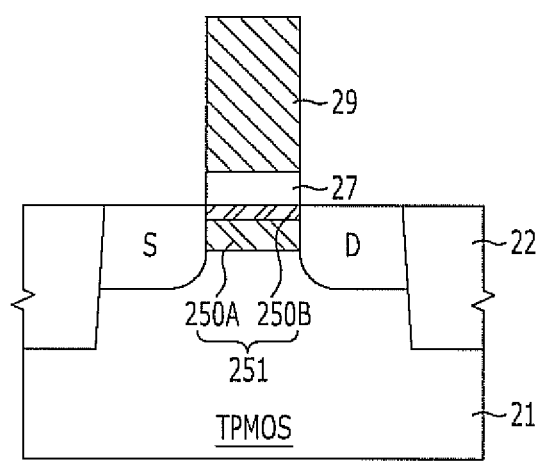

Referring to FIG. 1E, a gate electrode material is formed on the gate dielectric layer 27. Subsequently, by patterning the gate electrode material and the gate dielectric layer 27, a gate stack including the gate dielectric layer 27 and a gate electrode 29 may be formed. In succession, an ion implantation process for forming a source region S and a drain region D may be performed. A P-type impurity may be ion-implanted to form the source region S and the drain region D. While not shown, the source region S and the drain region D may further include a low concentration region (LDD). Furthermore, gate spacers may be additionally formed on both sidewalls of the gate stack.

FIGS. 2A to 2F are cross-sectional views illustrating a method of fabricating a semiconductor device in accordance with a second embodiment of the present invention.

Figure 2A:
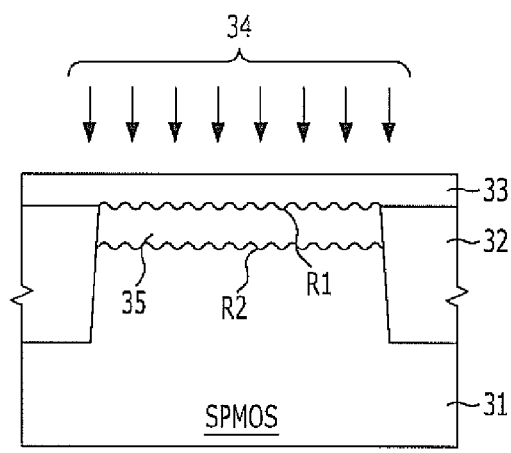
FIGS. 2A to 2F are cross-sectional views illustrating a method of fabricating a semiconductor device in accordance with a second embodiment of the present invention.

Referring to FIG. 2A, a substrate 31 includes a transistor region in which a transistor is formed. The transistor region may include an NMOSFET (hereinafter, referred to as an 'NMOS') or a PMOSFET (hereinafter, referred to as a 'PMOS'). Hereinafter, in this second embodiment, the transistor region is exemplified as a region in which a PMOS is formed. A PMOS region may include a PMOS having a slim gate dielectric layer ("SPMOS"). The substrate 31 may include silicon, for example, monocrystalline silicon.

Isolation regions 32 are formed in the substrate 31. The isolation regions 32 may be formed through an STI (shallow trench isolation) process. For example, after forming a pad layer (not shown) on the substrate 31, the pad layer and the substrate 31 are etched using an isolation mask (not shown). By performing such etching, trenches are defined. By gap-filling a dielectric layer in the trenches after defining the trenches, the isolation regions 32 are formed. As the isolation regions 32, a wall oxide, a liner and a spin-on dielectric (SOD) layer may be sequentially formed. The liner may include a silicon nitride liner and a silicon oxide liner.

Next, a passivation layer 33 is formed on the entire surface of the substrate 31. The passivation layer 33 serves as a screen in a subsequent ion implantation process. For example, the passivation layer 33 functions to minimize damage to the substrate 31 while ion-implanting a dopant or other materials into the substrate 31. The passivation layer 33 may be formed, for example, through a thermal oxidation process, and may include a silicon oxide. Here, the passivation layer 33 is referred to as a screen oxide. The passivation layer 33 may be formed to a thickness of 50~100 Å.

After forming the passivation layer 33, germanium ion implantation 34 is performed for the substrate 31. The germanium ion implantation 34 may be formed with energy of 1~10 KeV to a dose of $1\times10^{14}$~$4\times10^{17}$ atoms/cm$^3$ at a temperature of −150~50° C. The germanium ion implantation 34 may be performed for the transistor region, in particular, the channel region, of the substrate 31.

By performing the above-described germanium ion implantation 34, an amorphous germanium-containing region 35 with a desired depth is formed in the surface of the substrate 31. For example, as germanium reacts with the silicon constituent of the substrate 31, the amorphous germanium-containing region 35 with a silicon germanium (SiGe) structure is formed. The surface roughness of an upper surface R1 and a lower surface R2 of the amorphous germanium-containing region 35 is substantially great. Such great surface roughness is caused by physical damage resulting from ion bombardment upon ion implantation.

While not shown, a well ion implantation process and a channel ion implantation process generally known in the art may be performed before the germanium ion implantation 34.

In the case where the substrate 31 includes an NMOS region, a P-type well is formed, and in the case where the substrate 31 includes a PMOS region, an N-type well is formed. For example, in order to form a P-type well, a P-type impurity such as boron (B) or a boron difluoride (BF$_2$) may be implanted. Furthermore, in order to form an N-type well, an N-type impurity such as phosphorus (P) or arsenic (As) may be implanted.

After the well ion implantation process, a channel region may be formed through any reasonably suitable process for performing channel ion implantation process. An N channel region may be formed in an NMOS region, and a P channel region may be formed in a PMOS region. In order to form the P channel region, an N-type impurity such as phosphorus (P) or arsenic (As) may be implanted. In order to form the N channel region, a P-type impurity such as boron (B) may be implanted. The channel ion implantation process may be performed after the germanium ion implantation 34.

Figure 2B:
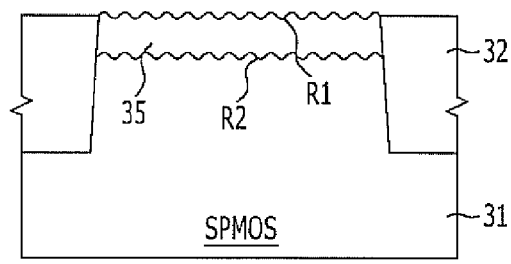

Referring to FIG. 2B, the passivation layer 33 is removed through a cleaning process. The passivation layer 33 may be removed using wet etching. For example, in the case where the passivation layer 33 includes a silicon oxide, a hydrofluoric acid (HF) or a chemical containing a hydrofluoric acid may be used.

Even after the passivation layer 33 is removed, the surface roughness of the upper surface R1 and the lower surface R2 of the amorphous germanium-containing region 35 is not improved.

Figure 2C:
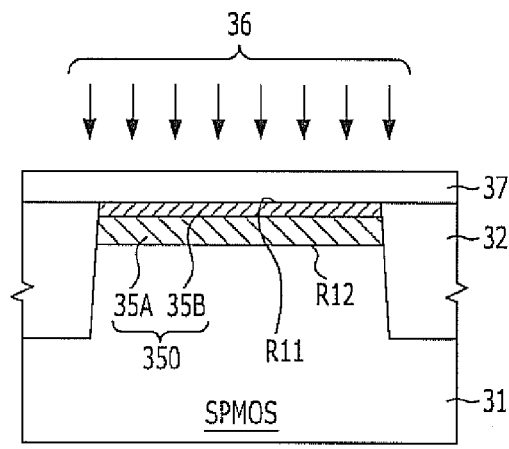

Referring to FIG. 2C, a plasma oxidation process 36 is performed. The plasma oxidation process 36 may be performed at a temperature of 350~500° C. By the plasma oxidation process 36, a sacrificial gate dielectric layer 37 is formed on the surface of the substrate 31. The sacrificial gate dielectric layer 37 includes a plasma oxide. The thickness of the sacrificial gate dielectric layer 37 may be about 55 Å. Since oxygen ions present in plasma serve as a main factor that determines an oxidation rate when performing the plasma oxidation process 36, oxidation is performed at a low temperature by controlling a bias. Through the plasma oxidation process 36, an amorphous germanium-containing region 350 is divided into a first amorphous germanium-containing region 35A and a second amorphous germanium-containing region 35B. The first amorphous germanium-containing region 35A is positioned under the second amorphous germanium-containing region 35B. The germanium concentration of the second amorphous germanium-containing region 35B is higher than that of the first amorphous germanium-containing region 35A. For example, as silicon is consumed from the upper part of the amorphous germanium-containing region 35 with the silicon germanium structure by the plasma oxidation process 36, the second amorphous germanium-containing region 35B containing a large amount of germanium is formed. A portion which is not influenced by the plasma oxidation process 36 remains as the first amorphous germanium-containing region 35A.

In this way, the amorphous germanium-containing region 350 has a concentration gradient by the plasma oxidation process 36. Also, the surface roughness of an upper surface R11 and a lower surface R12 of the amorphous germanium-containing region 350 may be improved through the plasma oxidation process 36.

The plasma oxidation process 36 has an oxidation rate greater than that of a dry oxidation process. Accordingly, oxidation is rapidly performed at a low temperature. Furthermore, oxidation of a silicon layer containing germanium is performed more rapidly than oxidation of a silicon layer not containing germanium.

Figure 2D:
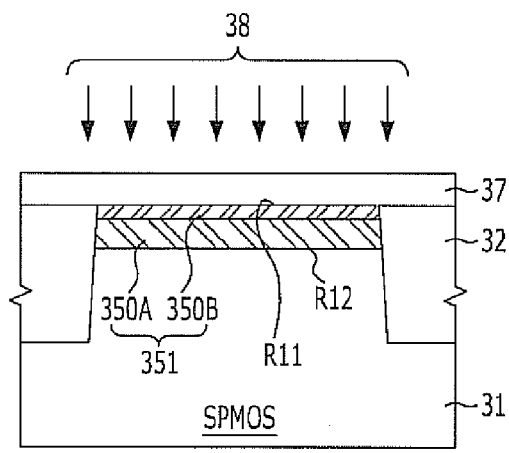

Referring to FIG. 2D, an annealing process 38 is performed. The annealing process 38 may include rapid thermal annealing (RTA). Rapid thermal annealing may be performed for 30 seconds at a temperature of 850~900° C. The amorphous germanium-containing region 350 is crystallized by the annealing process 38. Therefore, a crystalline germanium-containing region 351 is formed by the annealing process 38. The crystalline germanium-containing region 351 includes a first crystalline germanium-containing region 350A and a second crystalline germanium-containing region 350B. The germanium concentration of the second crystalline germanium-containing region 350B is higher than that of the first crystalline germanium-containing region 350A. For example, the second crystalline germanium-containing region 350B may have a germanium concentration close to 100%. Accordingly, the second crystalline germanium-containing region 350B may be referred to as a crystalline germanium-rich region. In the case where the substrate 31 includes monocrystalline silicon, the crystalline germanium-containing region 351 may be a monocrystalline germanium-containing region.

As described above, after the germanium ion implantation 34, the sacrificial gate dielectric layer 37 is formed through the plasma oxidation process 36. Also, by the low temperature plasma oxidation process 36, the second amorphous germanium-containing region 35B containing a large amount of germanium is formed. Moreover, the surface roughness of the upper surface and the lower surface of the amorphous germanium-containing region 350 may be improved by the plasma oxidation process 36. Furthermore, by performing the annealing process 38, the amorphous germanium-containing region 350 may be crystallized into the crystalline germanium-containing region 351.

By forming the crystalline germanium-containing region 351 under the sacrificial gate dielectric layer 37, the threshold voltage of the transistor may be controlled. In particular, in the case of a PMOS, a threshold voltage of a desired level may be obtained.

Figure 2E:
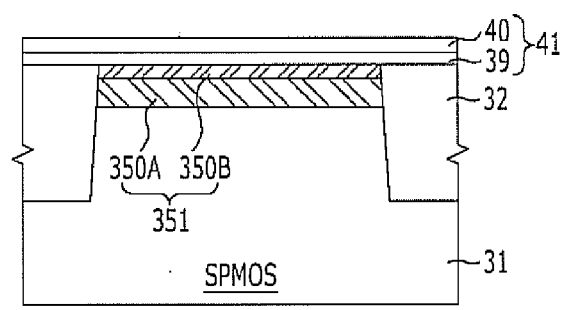

Referring to FIG. 2E, the sacrificial gate dielectric layer 37 is removed. The sacrificial gate dielectric layer 37 may be removed using a chemical containing a hydrofluoric acid (HF).

Subsequently, a gate dielectric layer 41 is formed on the entire surface of the substrate 31. The gate dielectric layer 41 may include a high-k dielectric material 40. The high-k dielectric material 40 may be formed to a thickness of 15~25 Å. An interlayer 39 may be additionally formed before forming the high-k dielectric material 40. The interlayer 39 may be formed to a thickness of 10~15 Å using wet ozone.

The high-k dielectric material 40 generally has a dielectric constant higher than the dielectric constant (about 3.9) of a silicon oxide ($SiO_2$). The high-k dielectric material 40 is physically substantially thicker and has a lower equivalent oxide thickness (EOT) than the silicon oxide. The high-k dielectric material 40 includes a metal-containing material such as a metal oxide, a metal silicate, a metal silicate nitride, and so forth. The metal oxide includes an oxide containing a metal such as hafnium (Hf), aluminum (Al), lanthanum (La), zirconium (Zr), and so forth and may include a hafnium oxide ($HfO_2$), an aluminum oxide ($Al_2O_3$), a lanthanum oxide ($LaO_2$), a zirconium oxide ($ZrO_2$), or a combination thereof. The metal silicate includes a silicate containing hafnium (Hf), zirconium (Zr), and so forth and may include a hafnium silicate (HfSiO), a zirconium silicate ($ZrSiO_x$), or a combination thereof. The metal silicate nitride is a material in which nitrogen is contained in a metal silicate. The high-k dielectric material 40 may include a metal silicate nitride. The metal silicate nitride may include a hafnium silicate nitride (HfSiON). By forming the gate dielectric layer 41 using the metal silicate nitride, a dielectric constant may be increased, and crystallization may be suppressed in a subsequent thermal process. According to an example, the high-k dielectric material 40 may be formed of a material with a dielectric constant of no less than 9.

Figure 2F:
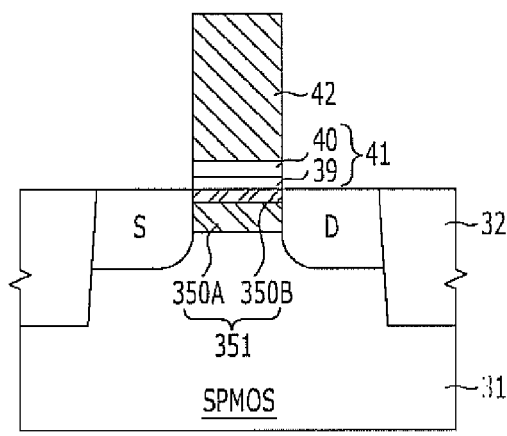

Referring to FIG. 2F, a gate electrode material is formed on the high-k dielectric material 40. Subsequently, by patterning the bate electrode material, the high-k dielectric material 40 and the interlayer 39, a gate stack including the gate dielectric layer 41 and a gate electrode 42 may be formed.

The gate electrode 42 includes a metal, a metal nitride or a metal carbide layer. For example, tungsten (W), tantalum (Ta), aluminum (Al), ruthenium (Ru), platinum (Pt), a titanium nitride (TIN), a tantalum nitride (TaN), a titanium carbide (TiC), a tantalum carbide (TaC), and combinations thereof may be used. Also, multiple layers thereof may be used. A capping layer (not shown) may be additionally formed on the gate electrode 42. The capping layer may include a polysilicon layer. The capping layer is a reaction preventing layer and serves as an oxidation preventing layer for preventing oxidation of the gate electrode 42.

In succession, an ion implantation process for forming a source region S and a drain region D may be performed. A P-type impurity may be ion-implanted to form the source region S and the drain region D. While not shown, the source region S and the drain region D may further include a low concentration region (LDD). Furthermore, gate spacers may be additionally formed on both sidewalls of the gate stack.

FIGS. 3A to 3E are cross-sectional views illustrating a method of fabricating a semiconductor device in accordance with a third embodiment of the present invention.

Figure 3A:
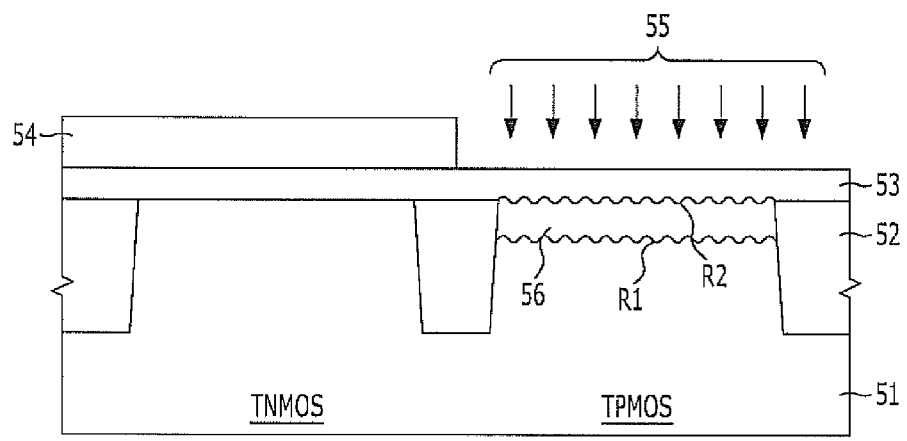
FIGS. 3A to 3E are cross-sectional views illustrating a method of fabricating a semiconductor device in accordance with a third embodiment of the present invention.

Referring to FIG. 3A, a substrate 51 may include a transistor region in which a transistor is formed. The transistor region may include an NMOSFET (hereinafter, referred to as an 'NMOS') or a PMOSFET (hereinafter, referred to as a 'PMOS'). Hereinafter, in this third embodiment, it is assumed that the substrate 51 includes a first transistor region TNMOS (defined below) and a second transistor region TPMOS. The first transistor region TNMOS is an NMOS region which has a thick gate dielectric layer, and the second transistor region TPMOS is a PMOS region which has a thick gate dielectric layer. Here, the gate dielectric layer means a gate dielectric layer with a substantial thickness and may generally include a transistor for a high voltage. The substrate 51 may include silicon, for example, monocrystalline silicon.

Isolation regions 52 are formed in the substrate 51. The isolation regions 52 may be formed through an STI (shallow trench isolation) process. For example, after forming a pad layer (not shown) on the substrate 51, the pad layer and the substrate 51 are etched using an isolation mask (not shown). By performing such etching, trenches are defined. By gap-filling a dielectric layer in the trenches after defining the trenches, the isolation regions 52 are formed. As the isolation regions 52, a wall oxide, a liner and a spin-on dielectric (SOD) layer may be sequentially formed. The liner may include a silicon nitride liner and a silicon oxide liner.

Next, a passivation layer 53 is formed on the entire surface of the substrate 51. The passivation layer 53 serves as a screen in a subsequent ion implantation process. For example, the passivation layer 53 functions to minimize damage to the substrate 51 while ion-implanting a dopant or other materials into the substrate 51. The passivation layer 53 may be formed, for example, through a thermal oxidation process, and may include a silicon oxide. Here, the passivation layer 53 is referred to as a screen oxide. The passivation layer 53 may be formed to a thickness of 50~100 Å.

After forming the passivation layer 53, a photoresist pattern 54 is formed to open any one transistor region of the first transistor region and the second transistor region. Here, the photoresist pattern 54 opens the second transistor region TPMOS.

Germanium ion implantation 55 is performed for the second transistor region TPMOS of the substrate 51 by using the photoresist pattern 54 as an ion implantation mask. The germanium ion implantation 55 may be formed with energy of 1~10 KeV to a dose of $1\times10^{14}$~$1\times10^{17}$ atoms/cm$^3$ at a temperature of −150~−50° C. The germanium ion implantation 55 may be performed for the second transistor region TPMOS, in particular, the channel region, of the substrate 51.

As the germanium ion implantation 55 is performed in this way, an amorphous germanium-containing region 56 with a desired depth is formed in the surface of the substrate 51. For example, as germanium reacts with the silicon constituent of the substrate 51, the amorphous germanium-containing region 56 with a silicon germanium (SiGe) structure is formed. The surface roughness of an upper surface R1 and a lower surface R2 of the amorphous germanium-containing region 56 is substantially great. Such great surface roughness is caused by physical damage resulting from ion bombardment upon ion implantation.

While not shown, a well ion implantation process and a channel ion implantation process generally known in the art may be performed before the germanium ion implantation 55.

In the case where the substrate 51 includes a TNMOS region, a P-type well is formed, and in the case where the substrate 51 includes a TPMOS region, an N-type well is formed. For example, in order to form a P-type well, a P-type impurity such as boron (B) or a boron difluoride (BF$_2$) may be implanted. Furthermore, in order to form an N-type well, an N-type impurity such as phosphorus (P) or arsenic (As) may be implanted.

After the well ion implantation process, a channel region may be formed through any reasonably suitable process for performing channel ion implantation. An N channel region may be formed in a TNMOS region, and a P channel region may be formed in a TPMOS region. In order to form the P channel region, an N-type impurity such as phosphorus (P) or arsenic (As) may be implanted. In order to form the N channel region, a P-type impurity such as boron (B) may be implanted. The channel ion implantation process may be performed after the germanium ion implantation 55.

Figure 3B:
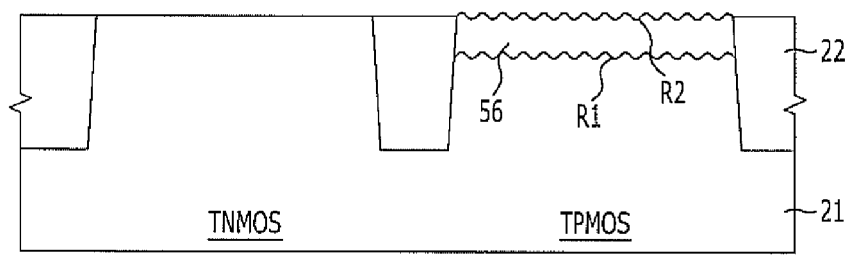

Referring to FIG. 3B, the passivation layer 53 is removed through a cleaning process. The passivation layer 53 may be removed using wet etching. For example, in the case where the passivation layer 53 includes a silicon oxide, a hydrofluoric acid (HF) or a chemical containing a hydrofluoric acid may be used.

Even after the passivation layer 53 is removed, the surface roughness of the upper surface R1 and the lower surface R2 of the amorphous germanium-containing region 56 is not improved.

Figure 3C:
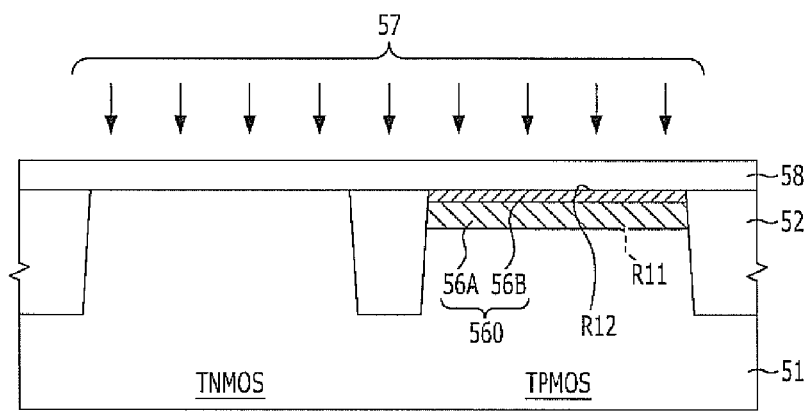

Referring to FIG. 3C, a plasma oxidation process 57 is performed. The plasma oxidation process 57 may be performed at a temperature of 350~500° C. By the plasma oxidation process 57, a gate dielectric layer 58 is formed on the surface of the substrate 51. The gate dielectric layer 58 includes a plasma oxide. The thickness of the gate dielectric layer 58 may be about 55 Å. Since oxygen ions present in plasma serve as a main factor that determines an oxidation rate when performing the plasma oxidation process 57, oxidation is performed at a low temperature by controlling a bias. Through the plasma oxidation process 57, an amorphous germanium-containing region 560 is divided into a first amorphous germanium-containing region 56A and a second amorphous germanium-containing region 56B. The first amorphous germanium-containing region 56A is positioned under the second amorphous germanium-containing region 56B. The germanium concentration of the second amorphous germanium-containing region 56B is higher than that of the first amorphous germanium-containing region 56A. For example, as silicon is consumed from the upper part of the amorphous germanium-containing region 56 with the silicon germanium structure by the plasma oxidation process 57, the second amorphous germanium-containing region 56B containing a large amount of germanium is formed. A portion which is not influenced by the plasma oxidation process 57 remains as the first amorphous germanium-containing region 56A.

In this way, the amorphous germanium-containing region 560 has a concentration gradient by the plasma oxidation process 57. Also, the surface roughness of an upper surface R11 and a lower surface R12 of the amorphous germanium-containing region 560 may be improved through the plasma oxidation process 57.

The plasma oxidation process 57 has an oxidation rate greater than that of a dry oxidation process. Accordingly, oxidation is rapidly performed at a low temperature. Furthermore, oxidation of a silicon layer containing germanium is performed more rapidly than oxidation of a silicon layer not containing germanium.

Figure 3D:
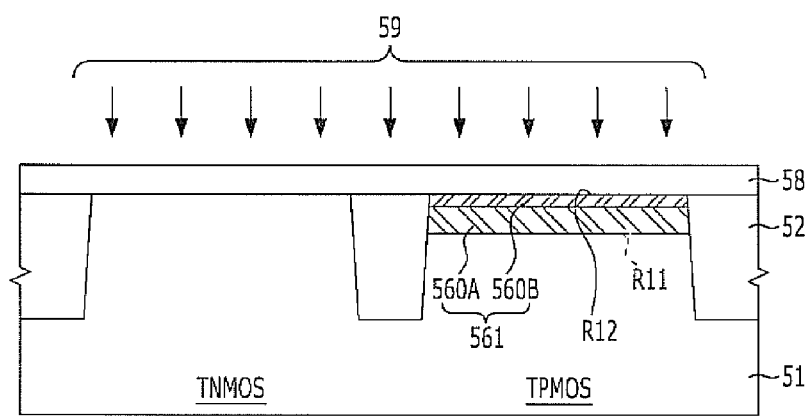

Referring to FIG. 3D, an annealing process 59 is performed. The annealing process 59 may include rapid thermal annealing (RTA). Rapid thermal annealing may be performed for 30 seconds at a temperature of 850~900° C. The amorphous germanium-containing region 560 is crystallized by the annealing process 59. Therefore, a crystalline germanium-containing region 561 is formed by the annealing process 59. The crystalline germanium-containing region 561 includes a first crystalline germanium-containing region 560A and a second crystalline germanium-containing region 560B. The germanium concentration of the second crystalline germanium-containing region 560B is higher than that of the first crystalline germanium-containing region 560A. For example, the second crystalline germanium-containing region 560B may have a germanium concentration close to 100%. Accordingly, the second crystalline germanium-containing region 560B may be referred to as a crystalline germanium-rich region. In the case where the substrate 51 includes monocrystalline silicon, the crystalline germanium-containing region 561 may be a monocrystalline germanium-containing region.

As described above, after the germanium ion implantation 55, the gate dielectric layer 58 is formed through the plasma oxidation process 57. Also, by the low temperature plasma oxidation process 57, the second amorphous germanium-containing region 56B containing a large amount of germanium is formed. Moreover, the surface roughness of the upper surface and the lower surface of the amorphous germanium-containing region 560 may be improved by the plasma oxidation process 57. Furthermore, by performing the annealing process 59, the amorphous germanium-containing region 560 may be crystallized into the crystalline germanium-containing region 561.

By forming the crystalline germanium-containing region 561 under the gate dielectric layer 58, the threshold voltage of the transistor may be controlled. In particular, in the case of a PMOS, a threshold voltage of a desired level may be obtained.

Figure 3E:
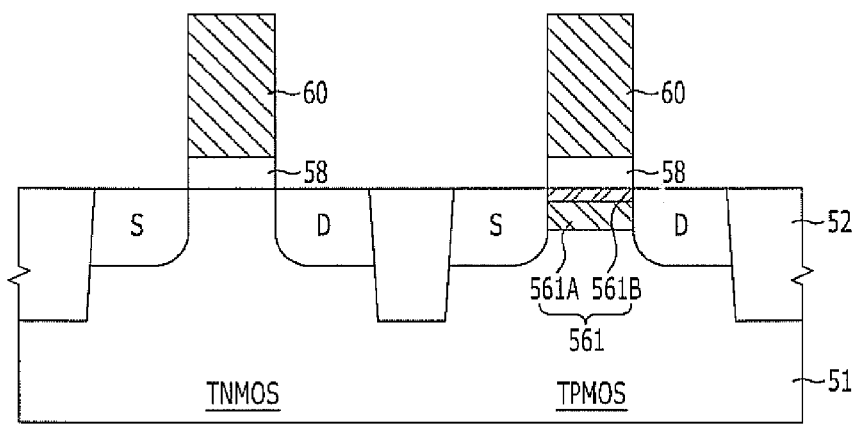

Referring to FIG. 3E, a gate electrode material is formed on the gate dielectric layer 58. Subsequently, by patterning the gate electrode material and the gate dielectric layer 58, gate stacks each including the gate dielectric layer 58 and a gate electrode 60 may be formed. The gate stacks are respectively formed in the first transistor region TNMOS and the second transistor region TPMOS. In succession, an ion implantation process for forming source regions S and drain regions D may be performed. In order to form the source regions S and the drain regions D, an N-type impurity may be ion-implanted in the TNMOS region, and a P-type impurity may be ion-implanted in the TPMOS region. While not shown, the source regions S and the drain regions D may further include low concentration regions ("LDD"). Furthermore, gate spacers may be additionally formed on both sidewalls of the gate stacks.

FIGS. 4A to 4F are cross-sectional views illustrating a method of fabricating a semiconductor device in accordance with a fourth embodiment of the present invention.

Figure 4:
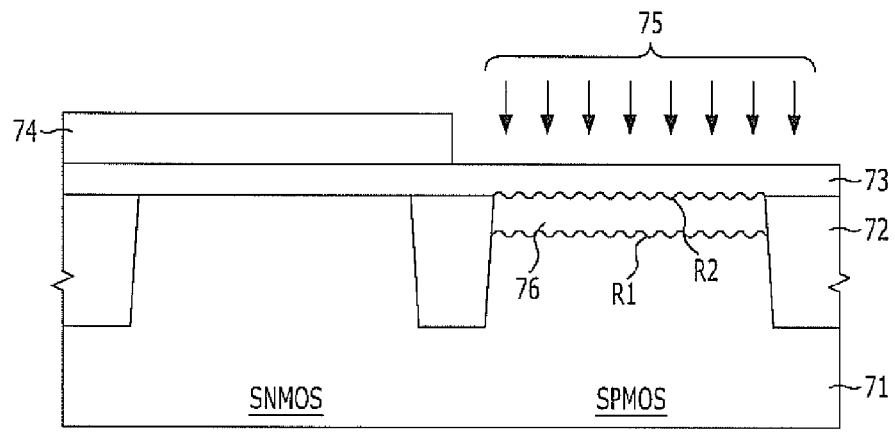
FIGS. 4A to 4F are cross-sectional views illustrating a method of fabricating a semiconductor device in accordance with a fourth embodiment of the present invention.

Referring to FIG. 4A, a substrate 71 is prepared. The substrate 71 may include a transistor region in which a transistor is formed. The transistor region may include an NMOSFET (hereinafter, referred to as an 'NMOS') or a PMOSFET (hereinafter, referred to as a 'PMOS'). Hereinafter, in this fourth embodiment, it is assumed that the substrate 71 includes a first transistor region SNMOS (defined below) and a second transistor region SPMOS. The first transistor region SNMOS is an NMOS region which has a slim gate dielectric layer, and the second transistor region SPMOS is a PMOS region which has a slim gate dielectric layer. Here, the gate dielectric layer means a gate dielectric layer with a small thickness, and may generally include a transistor for a low voltage. The substrate 71 may include silicon, for example, monocrystalline silicon.

Isolation regions 72 are formed in the substrate 71. The isolation regions 72 may be formed through an STI (shallow trench isolation) process. For example, after forming a pad layer (not shown) on the substrate 71, the pad layer and the substrate 71 are etched using an isolation mask (not shown). By performing such etching, trenches are defined. By gap-filling a dielectric layer in the trenches after defining the trenches, the isolation regions 72 are formed. As the isolation regions 72, a wall oxide, a liner and a spin-on dielectric (SOD) layer may be sequentially formed. The liner may include a silicon nitride liner and a silicon oxide liner.

Next, a passivation layer 73 is formed on the entire surface of the substrate 71. The passivation layer 73 serves as a screen in a subsequent ion implantation process. For example, the passivation layer 73 functions to minimize damage to the substrate 71 while ion-implanting a dopant or other materials into the substrate 71. The passivation layer 73 may be formed, for example, through a thermal oxidation process, and may include a silicon oxide. Here, the passivation layer 73 is referred to as a screen oxide. The passivation layer 73 may be formed to a thickness of 50~100 Å.

After forming the passivation layer 73, a photoresist pattern 74 is formed to open any one transistor region of the first transistor region and the second transistor region. Here, the photoresist pattern 74 opens the second transistor region SPMOS.

Germanium ion implantation 75 is performed for the second transistor region SPMOS of the substrate 71 by using the photoresist pattern 74 as an ion implantation mask. The germanium ion implantation 75 may be formed with energy of 1~10 KeV to a dose of $1\times10^{14}$~$1\times10^{17}$ atoms/cm$^3$ at a temperature of −150~−50° C. The germanium ion implantation 75 may be performed for the second transistor region SPMOS, in particular, the channel region, of the substrate 71.

As the germanium ion implantation 75 is performed in this way, an amorphous germanium-containing region 76 with a desired depth is formed in the surface of the substrate 71. For example, as germanium reacts with the silicon constituent of the substrate 71, the amorphous germanium-containing region 76 with a silicon germanium (SiGe) structure is formed. The surface roughness of an upper surface R1 and a lower surface R2 of the amorphous germanium-containing region 76 is substantially great. Such great surface roughness is caused by physical damage resulting from ion bombardment upon ion implantation.

While not shown, a well ion implantation process and a channel ion implantation process generally known in the art may be performed before the germanium ion implantation 75.

In the case where the substrate 71 includes an SNMOS region, a P-type well is formed, and in the case where the substrate 71 includes an SPMOS region, an N-type well is formed. For example, in order to form a P-type well, a P-type impurity such as boron (B) or a boron difluoride (BF$_2$) may be implanted. Furthermore, in order to form an N-type well, an N-type impurity such as phosphorus (P) or arsenic (As) may be implanted.

After the well ion implantation process, a channel region may be formed by any reasonably suitable process for performing the channel ion implantation process. An N channel region may be formed in an SNMOS region, and a P channel region may be formed in an SPMOS region. In order to form the P channel region, an N-type impurity such as phosphorus (P) or arsenic (As) may be implanted. In order to form the N channel region, a P-type impurity such as boron (B) may be implanted. The channel ion implantation process may be performed after the germanium ion implantation 75.

Figure 4B:
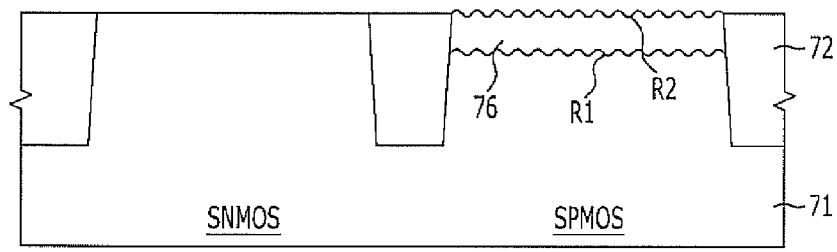

Referring to FIG. 4B, the passivation layer 73 is removed through a cleaning process. The passivation layer 73 may be removed using wet etching. For example, in the case where the passivation layer 73 includes a silicon oxide, a hydrofluoric acid (HF) or a chemical containing a hydrofluoric acid may be used.

Even after the passivation layer 73 is removed, the surface roughness of the upper surface R1 and the lower surface R2 of the amorphous germanium-containing region 76 is not improved.

Figure 4C:
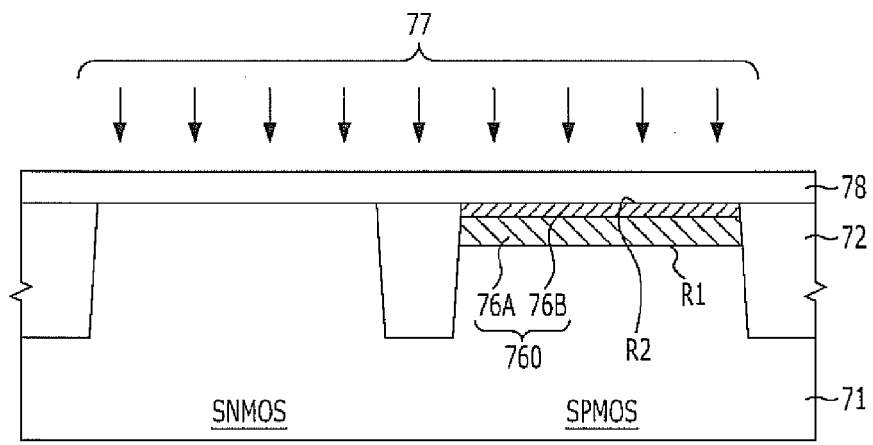

Referring to FIG. 4C, a plasma oxidation process 77 is performed. The plasma oxidation process 77 may be performed at a temperature of 350~500° C. By the plasma oxidation process 77, a sacrificial gate dielectric layer 78 is formed on the surface of the substrate 71. The sacrificial gate dielectric layer 78 includes a plasma oxide. The thickness of the sacrificial gate dielectric layer 78 may be about 55 Å. Since oxygen ions present in plasma serve as a main factor that determines an oxidation rate when performing the plasma oxidation process 77, oxidation is performed at a low temperature by controlling a bias. Through the plasma oxidation process 77, an amorphous germanium-containing region 760 is divided into a first amorphous germanium-containing region 76A and a second amorphous germanium-containing region 76B. The first amorphous germanium-containing region 76A is positioned under the second amorphous germanium-containing region 76B. The germanium concentration of the second amorphous germanium-containing region 76B is higher than that of the first amorphous germanium-containing region 76A. For example, as silicon is consumed from the upper part of the amorphous germanium-containing region 76 with the silicon germanium structure by the plasma oxidation process 77, the second amorphous germanium-containing region 76B containing a large amount of germanium is formed. A portion which is not influenced by the plasma oxidation process 77 remains as the first amorphous germanium-containing region 76A.

In this way, the amorphous germanium-containing region 760 has a concentration gradient by the plasma oxidation process 77. Also, the surface roughness of an upper surface R11 and a lower surface R12 of the amorphous germanium-containing region 760 may be improved through the plasma oxidation process 77.

The plasma oxidation process 77 has an oxidation rate greater than that of a dry oxidation process. Accordingly, oxidation is rapidly performed at a low temperature. Furthermore, oxidation of a silicon layer containing germanium is performed more rapidly than oxidation of a silicon layer not containing germanium.

Figure 4D:
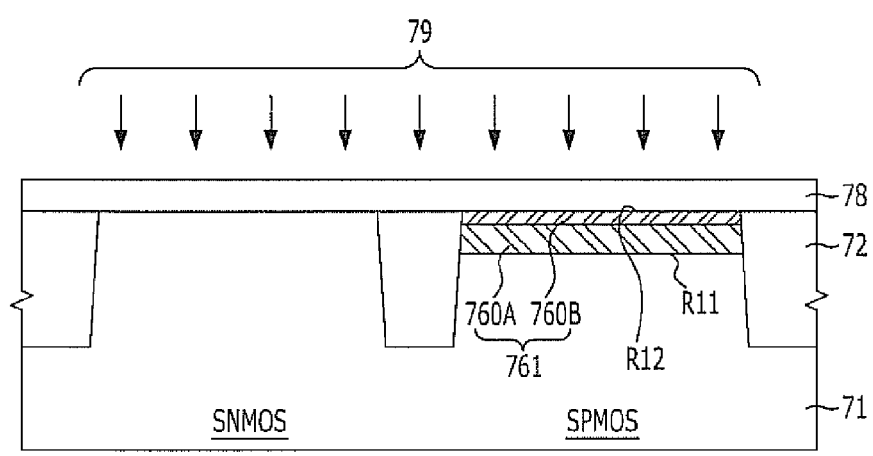

Referring to FIG. 4D, an annealing process 79 is performed. The annealing process 79 may include rapid thermal annealing (RTA). Rapid thermal annealing may be performed for 30 seconds at a temperature of 850~900° C. The amorphous germanium-containing region 760 is crystallized by the annealing process 79. Therefore, a crystalline germanium-containing region 761 is formed by the annealing process 79. The crystalline germanium-containing region 761 includes a first crystalline germanium-containing region 760A and a second crystalline germanium-containing region 760B. The germanium concentration of the second crystalline germanium-containing region 760B is higher than that of the first crystalline germanium-containing region 760A. For example, the second crystalline germanium-containing region 760B may have a germanium concentration close to 100%. Accordingly, the second crystalline germanium-containing region 760B may be referred to as a crystalline germanium-rich region. In the case where the substrate 71 includes monocrystalline silicon, the crystalline germanium-containing region 761 may be a monocrystalline germanium-containing region.

As described above, after the germanium ion implantation 75, the sacrificial gate dielectric layer 78 is formed through the plasma oxidation process 77. Also, by the low temperature plasma oxidation process 77, the second amorphous germanium-containing region 76B containing a large amount of germanium is formed. Moreover, the surface roughness of the upper surface and the lower surface of the amorphous germanium-containing region 760 may be improved by the plasma oxidation process 77. Furthermore, by performing the annealing process 79, the amorphous germanium-containing region 760 may be crystallized into the crystalline germanium-containing region 761.

By forming the crystalline germanium-containing region 761 under the sacrificial gate dielectric layer 78, the threshold voltage of the transistor may be controlled. In particular, in the case of a PMOS, a threshold voltage of a desired level may be obtained.

Figure 4E:
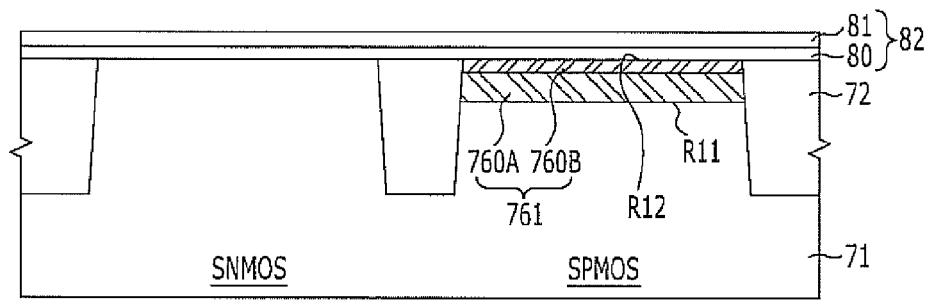

Referring to FIG. 4E, the sacrificial gate dielectric layer 78 is removed. The sacrificial gate dielectric layer 78 may be removed using a chemical containing a hydrofluoric acid (HF).

Subsequently, a gate dielectric layer 82 is formed on the entire surface of the substrate 71. The gate dielectric layer 82 may include a high-k dielectric material 81. The high-k dielectric material 81 may be formed to a thickness of 15~25 Å. An interlayer 80 may be additionally formed before forming the high-k dielectric material 81. The interlayer 80 may be formed to a thickness of 10~15 Å using wet ozone. The high-k dielectric material 81 generally has a dielectric constant higher than the dielectric constant (about 3.9) of a silicon oxide ($SiO_2$).

The high-k dielectric material 81 is physically substantially thicker and has a lower equivalent oxide thickness (EOT) than the silicon oxide. The high-k dielectric material 81 includes a metal-containing material such as a metal oxide, a metal silicate, a metal silicate nitride, and so forth. The metal oxide includes an oxide containing a metal such as hafnium (Hf), aluminum (Al), lanthanum (La), zirconium (Zr), and so forth and may include a hafnium oxide ($HfO_2$), an aluminum oxide ($Al_2O_3$), a lanthanum oxide ($LaO_2$), a zirconium oxide ($ZrO_2$), or a combination thereof. The metal silicate includes a silicate containing hafnium (Hf), zirconium (Zr), and so forth and may include a hafnium silicate (HfSiO), a zirconium silicate ($ZrSiO_x$), or a combination thereof. The metal silicate nitride is a material in which nitrogen is contained in a metal silicate. The high-k dielectric material 81 may include a metal silicate nitride. The metal silicate nitride may include a hafnium silicate nitride (HfSiON). By forming the gate dielectric layer 82 using the metal silicate nitride, a dielectric constant may be increased, and crystallization may be suppressed in a subsequent thermal process. According to an example, the high-k dielectric material 81 may be formed of a material with a dielectric constant of no less than 9.

Figure 4F:
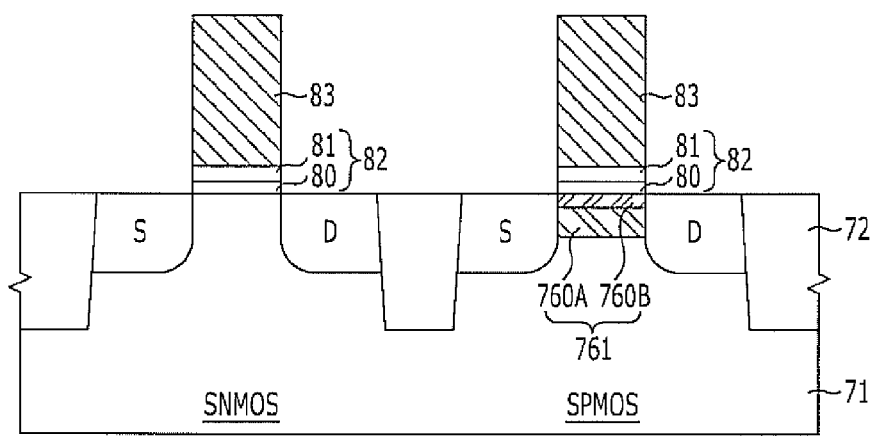

Referring to FIG. 4F, a gate electrode material is formed on the high-k dielectric material 81. Subsequently, by patterning the gate electrode material, the high-k dielectric material 81 and the interlayer 80, gate stacks each including the gate dielectric layer 82 and a gate electrode 83 may be formed. The gate stacks are respectively formed in the first transistor region SNMOS and the second transistor region SPMOS.

The gate electrode 83 includes a metal, a metal nitride or a metal carbide layer. For example, tungsten (W), tantalum (Ta), aluminum (Al), ruthenium (Ru), platinum (Pt), a titanium nitride (TIN), a tantalum nitride (TaN), a titanium carbide (TiC), a tantalum carbide (TaC), and combinations thereof may be used. Also, multiple layers thereof may be used. A capping layer (not shown) may be additionally formed on the gate electrode 83. The capping layer may include a polysilicon layer. The capping layer is a reaction preventing layer and serves as an oxidation preventing layer for preventing oxidation of the gate electrode 83.

In succession, an ion implantation process for forming source regions S and drain regions D may be performed. In order to form the source regions S and the drain regions D, an N-type impurity may be ion-implanted in the SNMOS region, and a P-type impurity may be ion-implanted in the SPMOS region. While not shown, the source regions S and the drain regions D may further include low concentration regions (LDD). Furthermore, gate spacers may be additionally formed on both sidewalls of the gate stacks.

FIGS. 5A to 5G are cross-sectional views illustrating a method of fabricating a semiconductor device in accordance with a fifth embodiment of the present invention.

Figure 5A:
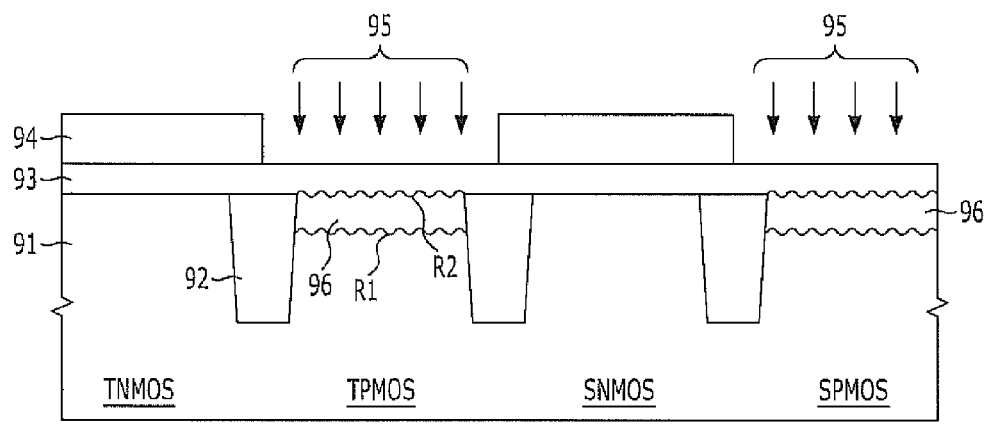
FIGS. 5A to 5G are cross-sectional views illustrating a method of fabricating a semiconductor device in accordance with a fifth embodiment of the present invention.

Referring to FIG. 5A, a substrate 91 is prepared. The substrate 91 may include transistor regions in which transistors are formed. The transistor regions may include a first transistor region TNMOS, a second transistor region TPMOS, a third transistor region SNMOS and a fourth transistor region SPMOS. The first transistor region TNMOS and the second transistor region TPMOS are regions where transistors with a thick gate dielectric layer are formed. The third transistor region SNMOS and the fourth transistor region SPMOS are regions where transistors with a slim gate dielectric layer are formed.

Isolation regions 92 are formed in the substrate 91. The isolation regions 92 may be formed through an STI (shallow trench isolation) process. For example, after forming a pad layer (not shown) on the substrate 91, the pad layer and the substrate 91 are etched using an isolation mask (not shown). By performing such etching, trenches are defined. By gap-filling a dielectric layer in the trenches after defining the trenches, the isolation regions 92 are formed. As the isolation regions 92, a wall oxide, a liner and a spin-on dielectric (SOD) layer may be sequentially formed. The liner may include a silicon nitride liner and a silicon oxide liner.

Next, a passivation layer 93 is formed on the entire surface of the substrate 91. The passivation layer 93 serves as a screen in a subsequent ion implantation process. For example, the passivation layer 93 functions to minimize damage to the substrate 91 while ion-implanting a dopant or other materials into the substrate 91. The passivation layer 93 may be formed, for example, through a thermal oxidation process, and may include a silicon oxide. Here, the passivation layer 93 is referred to as a screen oxide. The passivation layer 93 may be formed to a thickness of 50~100 Å.

After forming the passivation layer 93, a first photoresist pattern 94 is formed to open an optional transistor region among the first to fourth transistor regions. Here, the first photoresist pattern opens the second transistor region TPMOS and the fourth transistor region SPMOS.

Germanium ion implantation 95 is performed for the second and fourth transistor regions TPMOS and SPMOS of the substrate 91 by using the first photoresist pattern 94 as an ion implantation mask. The germanium ion implantation 95 may be formed with energy of 1~10 KeV to a dose of $1 \times 10^{14}$~$1 \times 10^{17}$ atoms/cm$^3$ at a temperature of $-150$~$-50°$ C. The germanium ion implantation 95 may be performed for the second and fourth transistor regions TPMOS and SPMOS, in particular, the channel region, of the substrate 91.

As the germanium ion implantation 95 is performed in this way, an amorphous germanium-containing region 96 with a desired depth is formed in the surface of the substrate 91. For example, as germanium reacts with the silicon constituent of the substrate 91, the amorphous germanium-containing region 96 with a silicon germanium (SiGe) structure is formed. The surface roughness of an upper surface R1 and a lower surface R2 of the amorphous germanium-containing region 96 is substantially great. Such great surface roughness is caused by physical damage resulting from ion bombardment upon ion implantation.

While not shown, a well ion implantation process and a channel ion implantation process generally known in the art may be performed before the germanium ion implantation 95.

In the case where the substrate 91 includes an SNMOS region, a P-type well is formed, and in the case where the substrate 91 includes an SPMOS region, an N-type well is formed. For example, in order to form a P-type well, a P-type impurity such as boron (B) or a boron difluoride (BF$_2$) may be implanted. Furthermore, in order to form an N-type well, an N-type impurity such as phosphorus (P) or arsenic (As) may be implanted.

After the well ion implantation process, a channel region may be formed by using any reasonably suitable process for performing the channel ion implantation process. An N channel region may be formed in an TNMOS region, and a P channel region may be formed in an TPMOS region. In order to form the P channel region, an N-type impurity such as phosphorus (P) or arsenic (As) may be implanted. In order to form the N channel region, a P-type impurity such as boron (B) may be implanted. The channel ion implantation process may be performed after the germanium ion implantation 95.

Figure 5B:
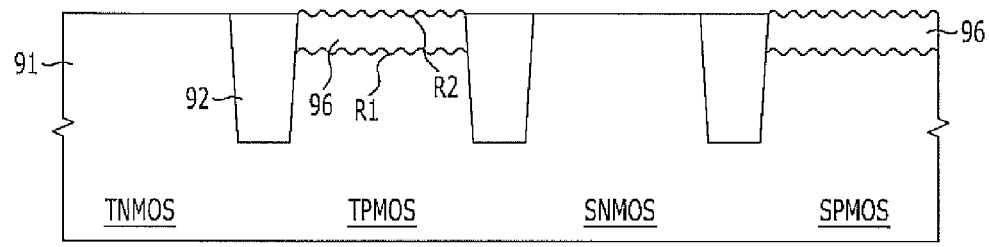

Referring to FIG. 5B, the passivation layer 93 is removed through a cleaning process. The passivation layer 93 may be removed using wet etching. For example, in the case where the passivation layer 93 includes a silicon oxide, a hydrofluoric acid (HF) or a chemical containing a hydrofluoric acid may be used.

Even after the passivation layer 93 is removed, the surface roughness of the upper surface R1 and the lower surface R2 of the amorphous germanium-containing region 96 is not improved.

Figure 5C:
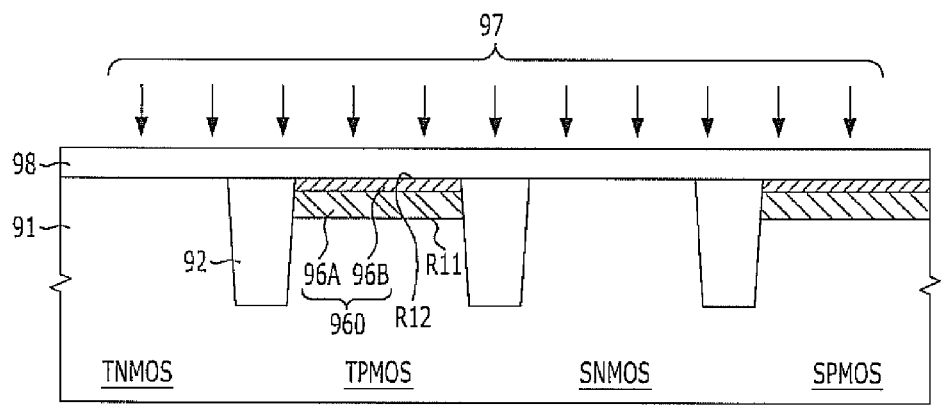

Referring to FIG. 5C, a plasma oxidation process 97 is performed. The plasma oxidation process 97 may be performed at a temperature of 350~500° C. By the plasma oxidation process 97, a first gate dielectric layer 98 is formed on the surface of the substrate 91. The first gate dielectric layer 98 includes a plasma oxide. The thickness of the first gate dielectric layer 98 may be about 55 Å. Since oxygen ions present in plasma serve as a main factor that determines an oxidation rate when performing the plasma oxidation process 97, oxidation is performed at a low temperature by controlling a bias. Through the plasma oxidation process 97, an amorphous germanium-containing region 960 is divided into a first amorphous germanium-containing region 96A and a second amorphous germanium-containing region 96B. The first amorphous germanium-containing region 96A is positioned under the second amorphous germanium-containing region 96B. The germanium concentration of the second amorphous germanium-containing region 96B is higher than that of the first amorphous germanium-containing region 96A. For example, as silicon is consumed from the upper part of the amorphous germanium-containing region 96 with the silicon germanium structure by the plasma oxidation process 97, the second amorphous germanium-containing region 96B containing a large amount of germanium is formed. A portion which is not influenced by the plasma oxidation process 97 remains as the first amorphous germanium-containing region 96A.

In this way, the amorphous germanium-containing region 960 has a concentration gradient by the plasma oxidation process 97. Also, the surface roughness of an upper surface R11 and a lower surface R12 of the amorphous germanium-containing region 960 may be improved through the plasma oxidation process 97.

The plasma oxidation process 97 has an oxidation rate greater than that of a dry oxidation process. Accordingly, oxidation is rapidly performed at a low temperature. Furthermore, oxidation of a silicon layer containing germanium is performed more rapidly than oxidation of a silicon layer not containing germanium.

Figure 5D:
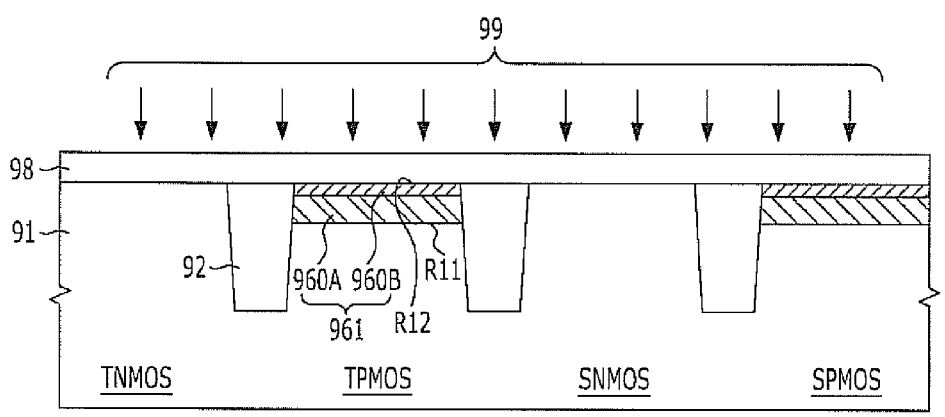

Referring to FIG. 5D, an annealing process 99 is performed. The annealing process 99 may include rapid thermal annealing (RTA). Rapid thermal annealing may be performed for 30 seconds at a temperature of 850~900° C. The amorphous germanium-containing region 960 is crystallized by the annealing process 99. Therefore, a crystalline germanium-containing region 961 is formed by the annealing process 99. The crystalline germanium-containing region 961 includes a first crystalline germanium-containing region 960A and a second crystalline germanium-containing region 960B. The germanium concentration of the second crystalline germanium-containing region 960B is higher than that of the first crystalline germanium-containing region 960A. For example, the second crystalline germanium-containing region 960B may have a germanium concentration close to 100%. Accordingly, the second crystalline germanium-containing region 960B may be referred to as a crystalline germanium-rich region. In the case where the substrate 91 includes monocrystalline silicon, the crystalline germanium-containing region 961 may be a monocrystalline germanium-containing region.

As described above, after the germanium ion implantation 95, the first gate dielectric layer 98 is formed through the plasma oxidation process 97. Also, by the low temperature plasma oxidation process 97, the second amorphous germanium-containing region 96B containing a large amount of germanium is formed. Moreover, the surface roughness of the upper surface and the lower surface of the amorphous germanium-containing region 960 may be improved by the plasma oxidation process 97. Furthermore, by performing the annealing process 99, the amorphous germanium-containing region 960 may be crystallized into the crystalline germanium-containing region 961.

By forming the crystalline germanium-containing region 961 under the first gate dielectric layer 98, the threshold voltage of the transistor may be controlled. In particular, in the case of a TPMOS and an SPMOS, a threshold voltage of a desired level may be obtained.

Figure 5E:
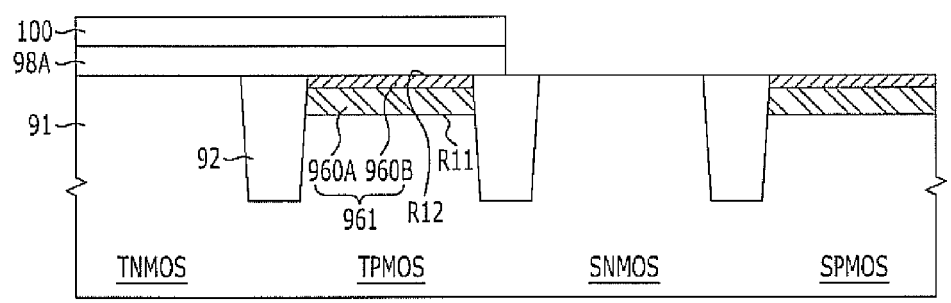

Referring to FIG. 5E, a second photoresist pattern 100 is formed on the first gate dielectric layer 98 to open an optional transistor region. The second photoresist pattern 100 opens the third transistor region and the fourth transistor region. Subsequently, the first gate dielectric layer 98 is selectively removed. The first gate dielectric layer 98 may be removed using a chemical containing a hydrofluoric acid (HF). By selectively removing the first gate dielectric layer 98 in this way, a first gate dielectric layer 98A remains on, for example, the first and second transistor regions TNMOS and TPMOS only.

Figure 5F:
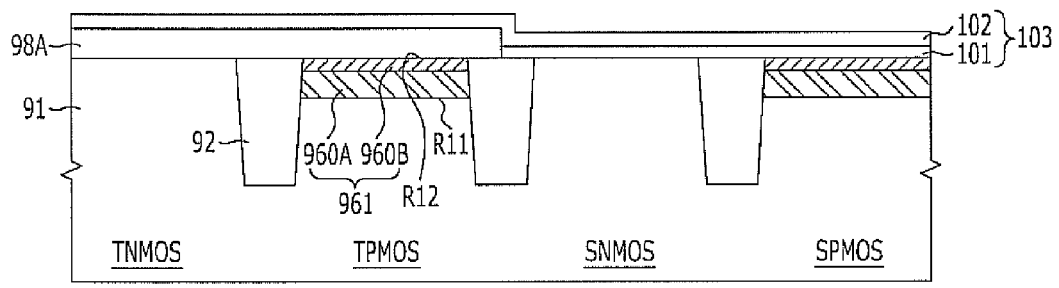

Referring to FIG. 5F, a second gate dielectric layer 103 is formed on the entire surface of the substrate 91. The second gate dielectric layer 103 may include a high-k dielectric material 102. The high-k dielectric material 102 may be formed to a thickness of 15~25 Å. An interlayer 101 may be additionally formed before forming the high-k dielectric material 102. The interlayer 101 may be formed to a thickness of 10~15 Å using wet ozone.

The high-k dielectric material 102 generally has a dielectric constant higher than the dielectric constant (about 3.9) of a silicon oxide ($SiO_2$). The high-k dielectric material 102 is physically substantially thicker and has a lower equivalent oxide thickness (EOT) than the silicon oxide. The high-k dielectric material 102 includes a metal-containing material such as a metal oxide, a metal silicate, a metal silicate nitride, and so forth. The metal oxide includes an oxide containing a metal such as hafnium (Hf), aluminum (Al), lanthanum (La), zirconium (Zr), and so forth and may include a hafnium oxide ($HfO_2$), an aluminum oxide ($Al_2O_3$), a lanthanum oxide ($LaO_2$), a zirconium oxide ($ZrO_2$), or a combination thereof. The metal silicate includes a silicate containing hafnium (Hf), zirconium (Zr), and so forth and may include a hafnium silicate (HfSiO), a zirconium silicate ($ZrSiO_x$), or a combination thereof. The metal silicate nitride is a material in which nitrogen is contained in a metal silicate. The high-k dielectric material 102 may include a metal silicate nitride. The metal silicate nitride may include a hafnium silicate nitride (HfSiON). By forming the second gate dielectric layer 103 using the metal silicate nitride, a dielectric constant may be increased, and crystallization may be suppressed in a subsequent thermal process. According to an example, the high-k dielectric material 102 may be formed of a material with a dielectric constant of no less than 9.

Figure 5G:
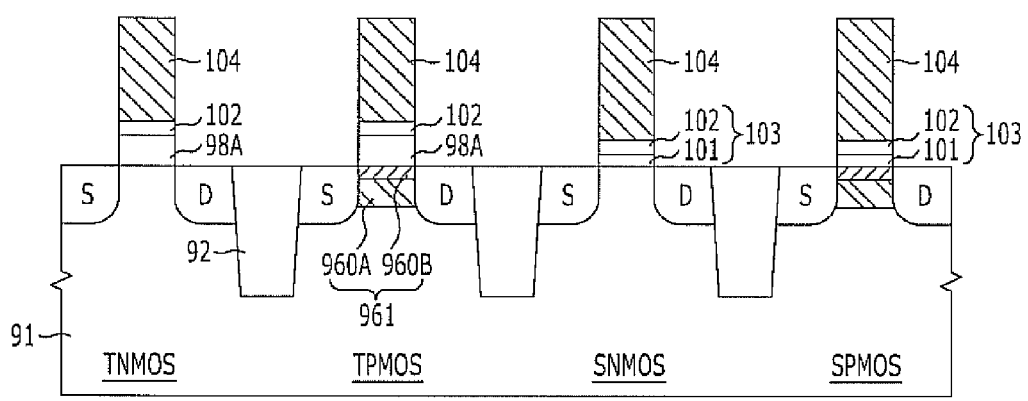

Referring to FIG. 5G, a gate electrode material is formed on the high-k dielectric material 102. Subsequently, by performing gate patterning, gate stacks are formed in the respective transistor regions, where the gate stacks each include the gate dielectric layer 82 and a gate electrode 83. The gate stacks of the third transistor region SNMOS and the fourth transistor region SPMOS include the second gate dielectric layer 103 and gate electrodes 104. The second gate dielectric layer 103 includes the interlayer 101 and the high-k dielectric material 102. The gate stacks of the first transistor region TNMOS and the second transistor region TPMOS include the first gate dielectric layer 98A, the high-k dielectric material 102 and gate electrodes 104.

The gate electrode 104 includes a metal, a metal nitride or a metal carbide layer. For example, tungsten (W), tantalum (Ta), aluminum (Al), ruthenium (Ru), platinum (Pt), a titanium nitride (TiN), a tantalum nitride (TaN), a titanium carbide (TIC), a tantalum carbide (TaC), and combinations thereof may be used. Also, multiple layers thereof may be used. A capping layer (not shown) may be additionally formed on the gate electrode 104. The capping layer may include a polysilicon layer. The capping layer is a reaction preventing layer and serves as an oxidation preventing layer for preventing oxidation of the gate electrode 104.

In succession, an ion implantation process for forming source regions S and drain regions D may be performed. In order to form the source regions S and the drain regions D, an N-type impurity may be ion-implanted in the TNMOS region and the SNMOS region, and a P-type impurity may be ion-implanted in the TPMOS region and the SPMOS region. While not shown, the source regions S and the drain regions D may further include low concentration regions (LDD). Furthermore, gate spacers may be additionally formed on both sidewalls of the gate stacks.

Figure 6:
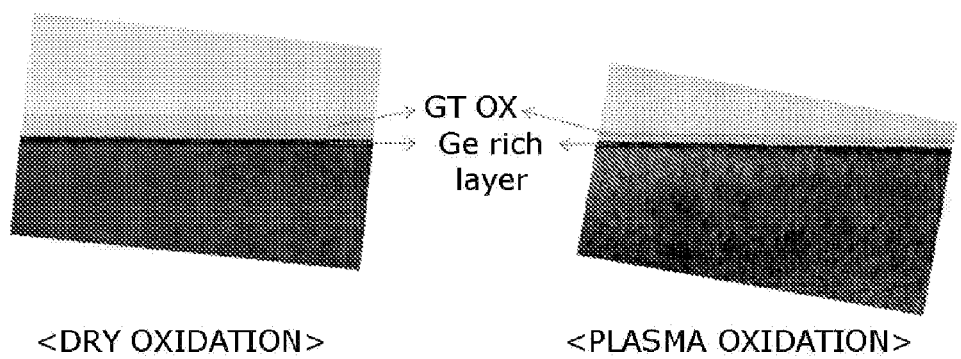
FIG. 6 illustrates cases in which dry oxidation and plasma oxidation are performed for a substrate ion-implanted with germanium.

FIG. 6 illustrates cases in which dry oxidation and plasma oxidation are performed for a substrate ion-implanted with germanium. FIG. 6 is of photographs obtained by photographing transistors TPMOS which are formed with thick gate dielectric layers.

Referring to FIG. 6, it can be seen that the thickness of a gate dielectric layer (see the reference symbol GT OX) may be more decreased in the case of performing plasma oxidation than in the case of performing dry oxidation for a substrate ion-implanted with germanium. A germanium-rich layer may be formed in both cases of the dry oxidation and the plasma oxidation.

As can be readily seen from FIG. 6, in the case of performing the dry oxidation for the substrate ion-implanted with germanium, while advantages are provided in that crystallization of an amorphous region and formation of a gate dielectric layer are simultaneously realized, the thickness of the gate dielectric layer abruptly increases. This is because the dangling bonds of silicon lattices damaged by ion implantation easily couple with oxygen ($O_2$) and the growth of an oxide layer increases. For example, when the dry oxidation is performed, the thickness of the gate dielectric layer becomes about 130 Å in a region implanted with germanium ions and about 55 Å in a region not implanted with germanium ions.

When a plasma oxidation process is performed as in the embodiments of the present invention, there is no substantial thickness difference between a region implanted with germanium ions and a region not implanted with germanium ions. This is because negative oxygen ions (O—) present in plasma serve as a main factor that determines an oxidation rate such that it is possible to form an oxide at a low temperature (for example, 350° C.) and form a germanium-rich layer by controlling a bias. By subsequently performing rapid thermal annealing, an amorphous layer is crystallized.

Figure 7:
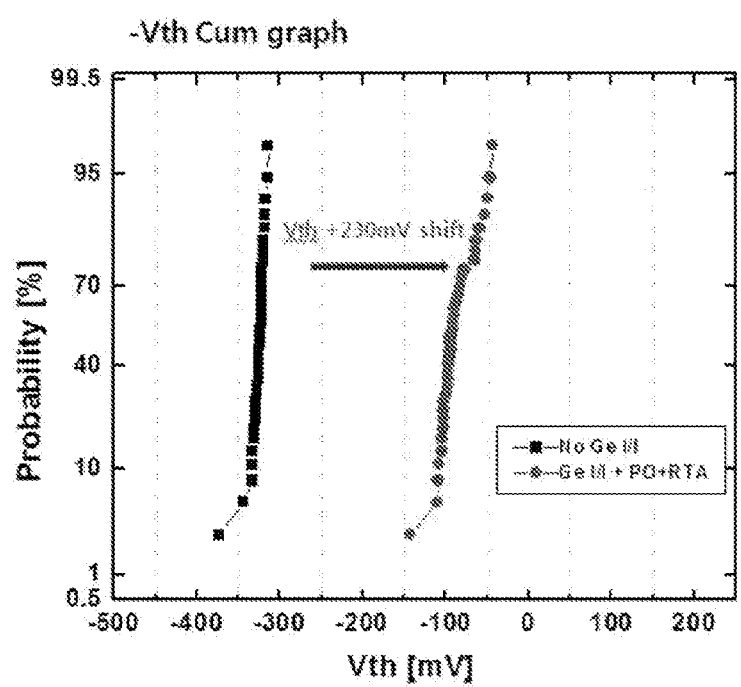
FIG. 7 is a graph showing a threshold voltage change according to germanium ion implantation, plasma oxidation and annealing.

FIG. 7 is a graph showing a threshold voltage change according to germanium ion implantation, plasma oxidation and annealing.

Referring to FIG. 7, a threshold voltage may be shifted more in the case of performing germanium ion implantation, plasma oxidation and annealing (Ge I/I+PO+RTA) than in the case of not performing germanium ion implantation (no Ge I/I). For example, the threshold voltage is shifted in the positive direction by about 230 mV and thus may improve PMOS characteristics.

The semiconductor device in accordance with the embodiment of the present invention may be included in a memory cell and a memory cell array. Bit lines and word lines may store or output data on the basis of voltages applied by a column decoder and a row decoder which are connected with the memory cell array.

The memory cell array according to the embodiment of the present invention may be included in a memory device. The memory device may include a memory cell array, a row decoder, a column decoder and sense amplifiers. The row decoder selects a word line corresponding to a memory cell for which a read operation or a write operation is to be performed, among the word lines of the memory cell array, and outputs a word line select signal to the memory cell array. The column decoder selects a bit line corresponding to a memory cell for which a read operation or a write operation is to be performed, among the bit lines of the memory cell array, and outputs a bit line select signal to the memory cell array. The sense amplifiers sense the data stored in the memory cells which are selected by the row decoder and the column decoder.

The memory device according to the embodiment of the present invention may be applied to a DRAM (dynamic random access memory), and is not limited to such and may also be applied to an SRAM (static random access memory), a flash memory, an FeRAM (ferroelectric random access memory), an MRAM (magnetic random access memory), a PRAM (phase change random access memory), etc.

The main product groups of the memory device may be applied not only to computing memories used in a desktop computer, a notebook computer and a server but also to graphics memories of various specifications and mobile memories which recently gain popularities with the development of mobile communication. Also, the memory device may be provided not only in a portable storage medium such as a memory stick, an MMC, an SD, a CF, an xD picture card and a USB flash device but also in various digital applications such as an MP3P, a PMP, a digital camera, a camcorder and a mobile phone. Furthermore, the memory device may be applied not only to a single semiconductor device but also to technical fields including an MCP (multi-chip package), a DOC (disk on chip) and an embedded device. Moreover, the memory device may be applied to a CIS (CMOS image sensor) and may be provided in various fields such as of a camera phone, a web camera and a small photographing device for a medical use.

The memory device according to the embodiment of the present invention may be used in a memory module. The memory module includes a plurality of memory devices mounted to a module substrate, a command link configured to allow the memory device to receive control signals (an address signal, a command signal and a clock signal) from an external controller, and a data link connected with the memory devices and configured to transmit data. The command link and the data link may be formed similarly to those used in a general semiconductor module. In the memory module, eight memory devices may be mounted to the front surface of the module substrate, and memory devices may be mounted the same to the back surface of the module substrate. That is to say, memory devices may be mounted to one side or both sides of the module substrate, and the number of mounted memory devices is not limited. In addition, the material and the structure of the module substrate are not specifically limited.

The memory module according to the embodiment of the present invention may be used in a memory system. The memory system includes a controller which provides a bidirectional interface between at least one memory module to which a plurality of memory devices are mounted and an external system and is configured to control the operation of the memory module.

The memory system according to the embodiment of the present invention may be used in an electronic unit. The electronic unit includes a memory system and a processor electrically connected therewith. The processor includes a CPU (central processing unit), an MPU (micro processor unit), an MCU (micro controller unit), a GPU (graphics processing unit) or a DSP (digital signal processor). The CPU or MPU has a combined form of an ALU (arithmetic logic unit) as an arithmetic logic operation unit and a CU (control unit) for reading and analyzing a command and controlling respective units. When the processor is the CPU or the MPU, the electronic unit may include a computer instrument or a mobile instrument. The GPU as a CPU for graphics is a processor for calculating numbers with decimal points and showing graphics in real time. When the processor is the GPU, the electronic unit may include a graphic instrument. The DSP is a processor for converting an analog signal (for example, voice) into a digital signal at a high speed and using a calculation result or converting a digital signal into an analog signal. The DSP mainly calculates digital values. When the processor is the DSP, the electronic unit may include a sound and image instrument. Besides, the processor include an APU (accelerate processor unit) being a processor which has a combined form of CPU and GPU and includes the role of a graphic card.

As is apparent from the above descriptions, according to the embodiments of the present invention, due to the fact that germanium ion implantation is performed and subsequently a plasma oxidation process at a low temperature and annealing are sequentially performed, an amorphous region may be crystallized through annealing, and a surface roughness may be improved through the plasma oxidation process. Also, by forming a germanium-rich region in the surface of a channel region, a uniform threshold voltage shifted in the positive direction may be secured. Furthermore, a thick gate dielectric layer with the same thickness may be formed in an NMOS region and a PMOS region.

As a consequence, it is possible to realize optimization of a threshold voltage while securing mobility, and processes may be simplified.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
   ion-implanting germanium into a monocrystalline silicon-containing substrate;
   forming a gate oxide layer over a surface of the monocrystalline silicon-containing substrate and forming, under the gate oxide layer, a germanium-rich region in which the germanium is concentrated, by performing a plasma oxidation process; and
   crystallizing the germanium-rich region by performing an annealing process.

2. The method of claim 1, wherein the method further comprises:
   removing the gate oxide layer after the crystallizing of the germanium-rich region; and
   forming a gate dielectric layer thinner than the gate oxide layer over the crystallized germanium-rich region.

3. The method of claim 2, wherein the method further comprises:
   forming an interlayer over the crystallized germanium-rich region before the forming of the gate dielectric layer.

4. The method of claim 1, wherein the ion-implanting of the germanium is performed for a channel region of a transistor.

5. The method of claim 1, wherein the ion-implanting of the germanium is performed for a channel region of a PMOSFET.

6. The method of claim 1, wherein the substrate includes an NMOSFET region and a PMOSFET region and the ion-implanting of the germanium is performed for the PMOSFET.

7. The method of claim 1, wherein the method further comprises:
   forming a passivation layer over the monocrystalline silicon-containing substrate before the ion-implanting of the germanium.

8. The method of claim 7, wherein the method further comprises:
   removing, after the ion-implanting of the germanium, the passivation layer through a cleaning process.

9. The method of claim 1, wherein the plasma oxidation process is performed at a temperature lower than a temperature at which the annealing process is performed.

10. A method for fabricating a semiconductor device, comprising:
    ion-implanting germanium into a monocrystalline silicon-containing substrate, wherein the substrate includes a first region and a second region;
    forming a first gate dielectric layer over a surface of the monocrystalline silicon-containing substrate and forming, under the first gate dielectric layer, a germanium-rich region in which the germanium is concentrated, by performing a plasma oxidation process;
    crystallizing the germanium-rich region by performing an annealing process;
    selectively removing the first gate dielectric layer at the second region; and
    forming a second gate dielectric layer over an entire surface of the monocrystalline silicon-containing substrate.

11. The method of claim 10, wherein the second gate dielectric layer is formed thinner than the first gate dielectric layer.

12. The method of claim 10, wherein the method further comprises:
    forming an interlayer over the crystallized germanium-rich region of the second region before the forming of the second gate dielectric layer.

13. The method of claim 10, wherein, in the forming of the second gate dielectric layer, the second gate dielectric layer comprises a high-k dielectric material with a dielectric constant greater than 7.

14. The method of claim 10, wherein the first region comprises a PMOSFET region with a thick gate dielectric layer and the second region comprises a PMOSFET region with a slim gate dielectric layer.

15. A method for fabricating a semiconductor device, comprising:
    ion-implanting germanium into a second region of a monocrystalline silicon-containing substrate, wherein the monocrystalline silicon-containing substrate includes a first region and the second region;
    forming a gate oxide layer over a surface of the monocrystalline silicon-containing substrate and forming, under the gate oxide layer of the second region, a germanium-rich region in which the germanium is concentrated, by performing a plasma oxidation process; and
    crystallizing the germanium-rich region by performing an annealing process.

16. The method of claim 15, wherein the method further comprises:
    selectively removing the gate oxide layer of the second region after the crystallizing of the germanium-rich region; and
    forming a gate dielectric layer thinner than the gate oxide layer over an entire surface of the monocrystalline silicon-containing substrate.

17. The method of claim 16, wherein the method further comprises:

forming an interlayer over the crystallized germanium-rich region of the second region before the forming of the gate dielectric layer.

18. The method of claim 16, wherein, in the forming of the gate dielectric layer, the gate dielectric layer comprises a high-k dielectric material with a dielectric constant greater than 7.

19. The method of claim 15, wherein the first region comprises an NMOSFET region with a thick gate dielectric layer or an NMOSFET region with a slim gate dielectric layer, and the second region comprises a PMOSFET region with a slim gate dielectric layer.

20. A method for fabricating a semiconductor device, comprising:
   ion-implanting germanium into a first region and a second region of a monocrystalline silicon-containing substrate, wherein the monocrystalline silicon-containing substrate includes the first region where a first PMOS is formed, the second region where a second PMOS is formed and a third region where an NMOS is formed;
   forming a first gate dielectric layer over a surface of the monocrystalline silicon-containing substrate and forming, under the first gate dielectric layer of the first and second regions, a germanium-rich region in which the germanium is concentrated, by performing a plasma oxidation process;
   crystallizing the germanium-rich region by performing an annealing process;
   selectively removing the first gate dielectric layer of the second region; and
   forming a second gate dielectric layer over an entire surface of the monocrystalline silicon-containing substrate.

21. The method of claim 20, wherein the first region comprises a PMOSFET region with a thick gate dielectric layer, and the second region comprises a PMOSFET region with a slim gate dielectric layer.

22. The method of claim 20, wherein the forming of the second gate dielectric layer comprises:
   forming an interlayer; and
   forming a high-k dielectric material over the interlayer.

* * * * *